(12) United States Patent
Park et al.

(10) Patent No.: US 11,825,731 B2
(45) Date of Patent: *Nov. 21, 2023

(54) DISPLAY DEVICE INCLUDING ELASTIC MEMBER

(71) Applicant: Samsung Display Co., LTD., Yongin-si (KR)

(72) Inventors: Jae Chun Park, Seoul (KR); Dongcheol Kim, Suwon-si (KR); Yun Jae Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/991,402

(22) Filed: Nov. 21, 2022

(65) Prior Publication Data

US 2023/0081522 A1    Mar. 16, 2023

Related U.S. Application Data

(63) Continuation of application No. 16/997,893, filed on Aug. 19, 2020, now Pat. No. 11,508,922.

(30) Foreign Application Priority Data

Aug. 27, 2019   (KR) .................. 10-2019-0104955

(51) Int. Cl.
*H10K 77/10*   (2023.01)
*H10K 59/131*   (2023.01)

(52) U.S. Cl.
CPC ......... *H10K 77/111* (2023.02); *H10K 59/131* (2023.02)

(58) Field of Classification Search
None
See application file for complete search history.

(56) References Cited

U.S. PATENT DOCUMENTS

| 9,954,985 | B2 | 4/2018 | Xu |
| 10,727,435 | B2 | 7/2020 | Kim et al. |
| 11,296,286 | B2 * | 4/2022 | Seo ..................... H01L 27/3244 |
| 11,508,922 | B2 * | 11/2022 | Park .................. G02F 1/133305 |

(Continued)

FOREIGN PATENT DOCUMENTS

| CN | 107437378 | 12/2017 |
| CN | 109616018 | 4/2019 |

(Continued)

OTHER PUBLICATIONS

Extended European Search Report dated Nov. 16, 2020, issued in European Patent Application No. 20192845.4.

(Continued)

*Primary Examiner* — J. E. Schoenholtz
(74) *Attorney, Agent, or Firm* — H.C. Park & Associates, PLC

(57) ABSTRACT

A display device including a display panel having a folding area and a bending area, a support member disposed on a bottom surface of the display panel and including a plurality of openings formed in the folding area, an elastic member disposed on a bottom surface of the support member and overlapping the openings in the folding area, and a first adhesive member disposed between the support member and the elastic member.

20 Claims, 13 Drawing Sheets

(56) References Cited

U.S. PATENT DOCUMENTS

| | | |
|---|---|---|
| 2015/0055287 A1 | 2/2015 | Seo |
| 2018/0097197 A1 | 4/2018 | Han et al. |
| 2018/0277414 A1* | 9/2018 | Wang .................. H01L 51/0097 |
| 2018/0307338 A1 | 10/2018 | Park |
| 2018/0350701 A1 | 12/2018 | Kim et al. |
| 2019/0067606 A1* | 2/2019 | Han .................... H01L 51/0097 |
| 2019/0115417 A1* | 4/2019 | Yamazaki .......... H10K 59/1213 |
| 2019/0165081 A1 | 5/2019 | Lee et al. |
| 2019/0165311 A1 | 5/2019 | Lee |
| 2020/0296190 A1 | 9/2020 | Zhang |

FOREIGN PATENT DOCUMENTS

| | | |
|---|---|---|
| KR | 10-2013-0118483 | 10/2013 |
| KR | 10-2016-0144912 | 12/2016 |
| KR | 10-1834793 | 3/2018 |
| KR | 10-2019-0049454 | 5/2019 |
| KR | 10-2019-0064183 | 6/2019 |
| WO | 2018-161753 | 9/2018 |

OTHER PUBLICATIONS

European Office Action dated Jul. 1, 2022, for European Patent Application No. 20192845.4.
Non-Final Office Action dated Apr. 13, 2022, in U.S. Appl. No. 16/997,893.
Notice of Allowance dated Jul. 20, 2022, in U.S. Appl. No. 16/997,893.
Notice of Allowance dated Aug. 4, 2022, in U.S. Appl. No. 16/997,893.

* cited by examiner

DISPLAY DEVICE INCLUDING ELASTIC MEMBER

CROSS-REFERENCE TO RELATED APPLICATIONS

This application is a Continuation of U.S. patent application Ser. No. 16/997,893, filed on Aug. 19, 2020, which claims priority from and the benefit of Korean Patent Application No. 10-2019-0104955, filed on Aug. 27, 2019, each of which is hereby incorporated by reference for all purposes as if fully set forth herein.

BACKGROUND

Field

Exemplary embodiments relate generally to a display device and, more specifically, to a flexible display device.

Discussion of the Background

Flat panel display devices are used as display devices and are replacing cathode ray tube display devices due to lightweight and thin characteristics thereof. Flat panel display devices may include a liquid crystal display device and an organic light emitting diode display device, for example.

Recently, a flexible display device, in which a lower substrate and an upper substrate of a display panel included the display device includes a flexible material, and a portion of the display panel may be bent and folded has been developed. For example, the lower substrate included in the display panel may be formed of a polyimide substrate, and the upper substrate included in the display panel may have a thin film encapsulation structure. In addition, the flexible display device may display an image even in a portion where the display panel is folded. In particular, the flexible display device may include a display area in which an image is displayed, and a portion of the display area may be folded. When the flexible display device is repeatedly folded or unfolded, creases may be generated in the folding area. In order to prevent the creases from being generated, the flexible display device may further include a support member including a plurality of openings disposed on a bottom surface of the display panel. The openings of the support member may overlap the portion where the display panel is folded. However, when foreign substances penetrate into the opening while the flexible display device is folded and unfolded, defects may be generated in the folding portion of the flexible display device.

The above information disclosed in this Background section is only for understanding of the background of the inventive concepts, and, therefore, it may contain information that does not constitute prior art.

SUMMARY

Electronic apparatus constructed according to exemplary embodiments of the invention have an improved reliability.

Additional features of the inventive concepts will be set forth in the description which follows, and in part will be apparent from the description, or may be learned by practice of the inventive concepts.

A display device according to an exemplary embodiment includes a display panel having a folding area and a bending area, a support member disposed on a bottom surface of the display panel and including a plurality of openings formed in the folding area, an elastic member disposed on a bottom surface of the support member and overlapping the openings in the folding area, and a first adhesive member disposed between the support member and the elastic member.

The display panel may further include a display area, a portion of the display area may be defined as the folding area, and a portion of a side surface of the display panel disposed in the display area may have a shape that is recessed inwardly.

The display panel may further include a display area and a pad area, and a portion of the display area and a portion of the pad area may be defined as the bending area.

The pad area may overlap the display area on the bottom surface of the display panel when the bending area is bent, and a width of the pad area may be less than a width of the display area.

The first adhesive member may have a first opening which overlaps the folding area.

The first opening may overlap the openings of the support member.

The display device may further include a first metal member disposed on a first portion of a bottom surface of the elastic member, and a second metal member disposed on a second portion of the bottom surface of the elastic member while being spaced apart from the first metal member.

Each of the first and second portions may partially overlap the folding area.

The display device may further include a second adhesive member disposed between the first and second metal members and the elastic member.

The second adhesive member may have a second opening which overlaps the folding area.

The second opening may overlap the openings of the support member.

The display device may further include a first step difference compensation member disposed on the first metal member in the second opening, and a second step difference compensation member disposed on the second metal member in the second opening.

A top surface of each of the first and second step difference compensation members may be spaced apart from the elastic member.

The openings of the support member may include first to $n^{th}$ openings arranged in a first direction parallel to a top surface of the display panel, n being an integer of 1 or more, and a $k^{th}$ opening among the first to nth openings may be located at a position shifted in a second direction perpendicular to the first direction, k being an even number between 1 and n.

The support member may further include protrusions located in a third direction opposite to the second direction with respect to each of $(k-1)^{th}$ and $(k+1)^{th}$ openings among the first to nth openings.

The display device may further include a trench disposed in a space between two adjacent protrusions, in which the elastic member may extend to a side surface of the support member to cover the trench.

The display device may further include a shock absorbing member disposed between the support member and the display panel.

The display device may further include a third adhesive member disposed between the shock absorbing member and the support member, and a fourth adhesive member disposed between the display panel and the shock absorbing member.

The third adhesive member may cover the openings.

The opening may be configured as an empty space.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
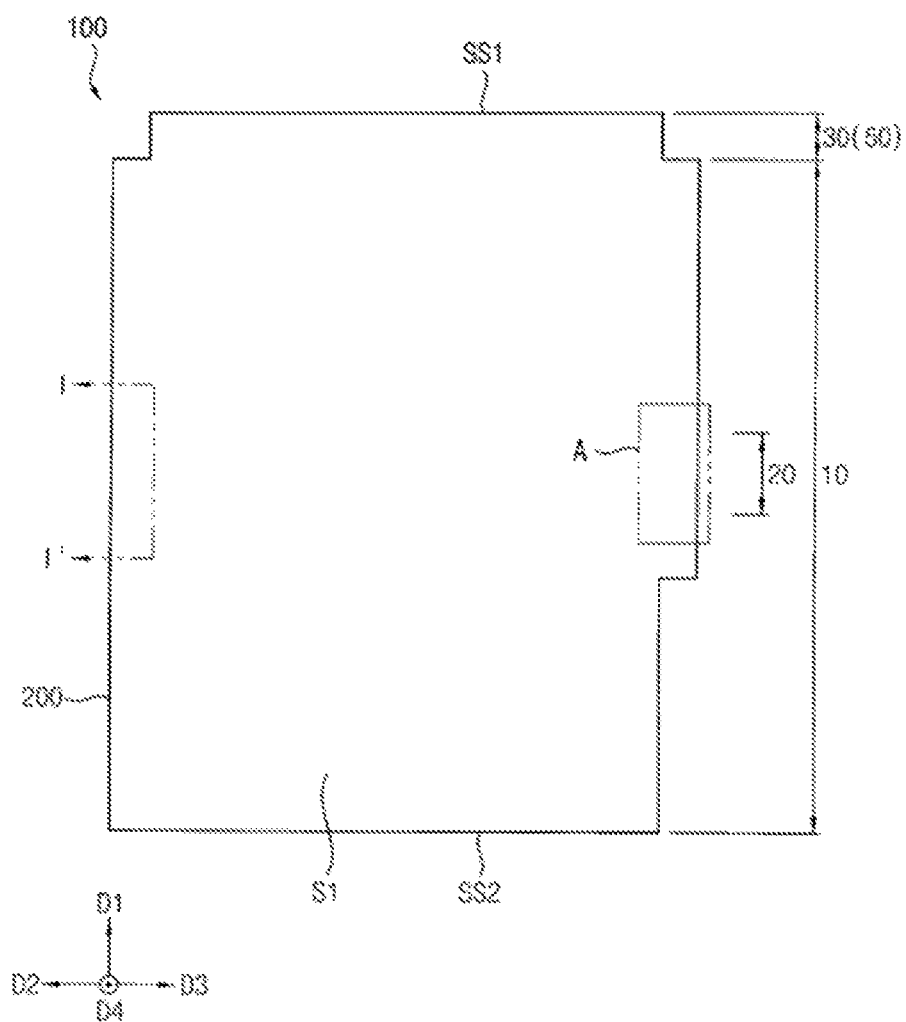
FIG. 1 is a plan view showing a display device according to an exemplary embodiment

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
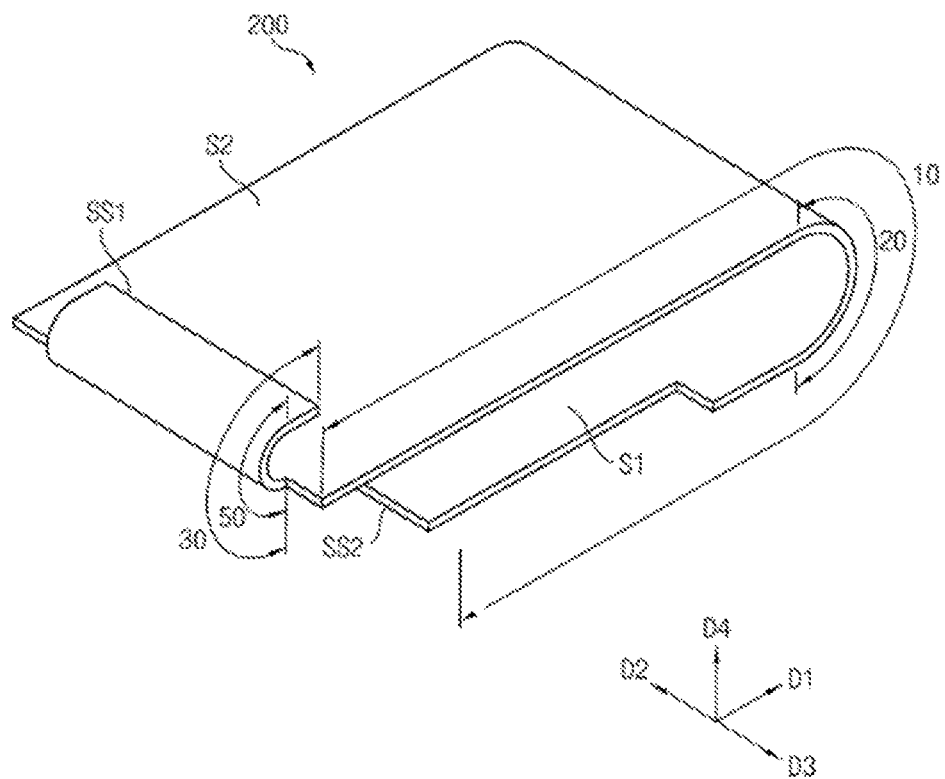
FIG. 2 is a perspective view showing a folded shape of a display panel included in the display device of FIG. 1.
Figure 3:
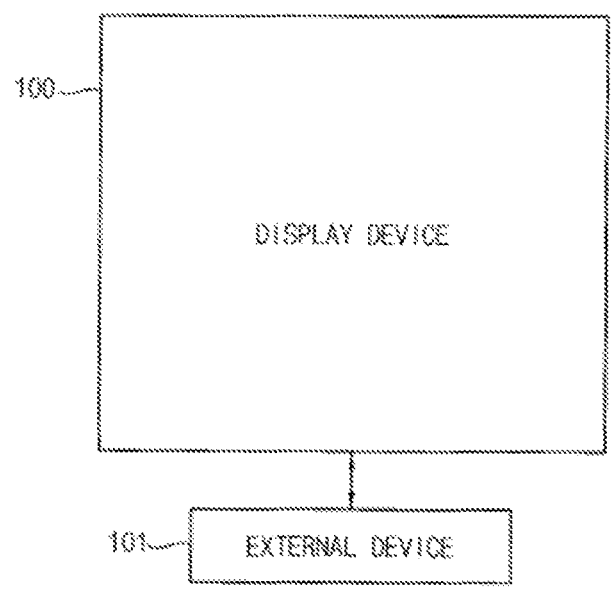
FIG. 3 is a block diagram showing an external device electrically connected to the display device of FIG. 1 according to an exemplary embodiment.
Figure 4:
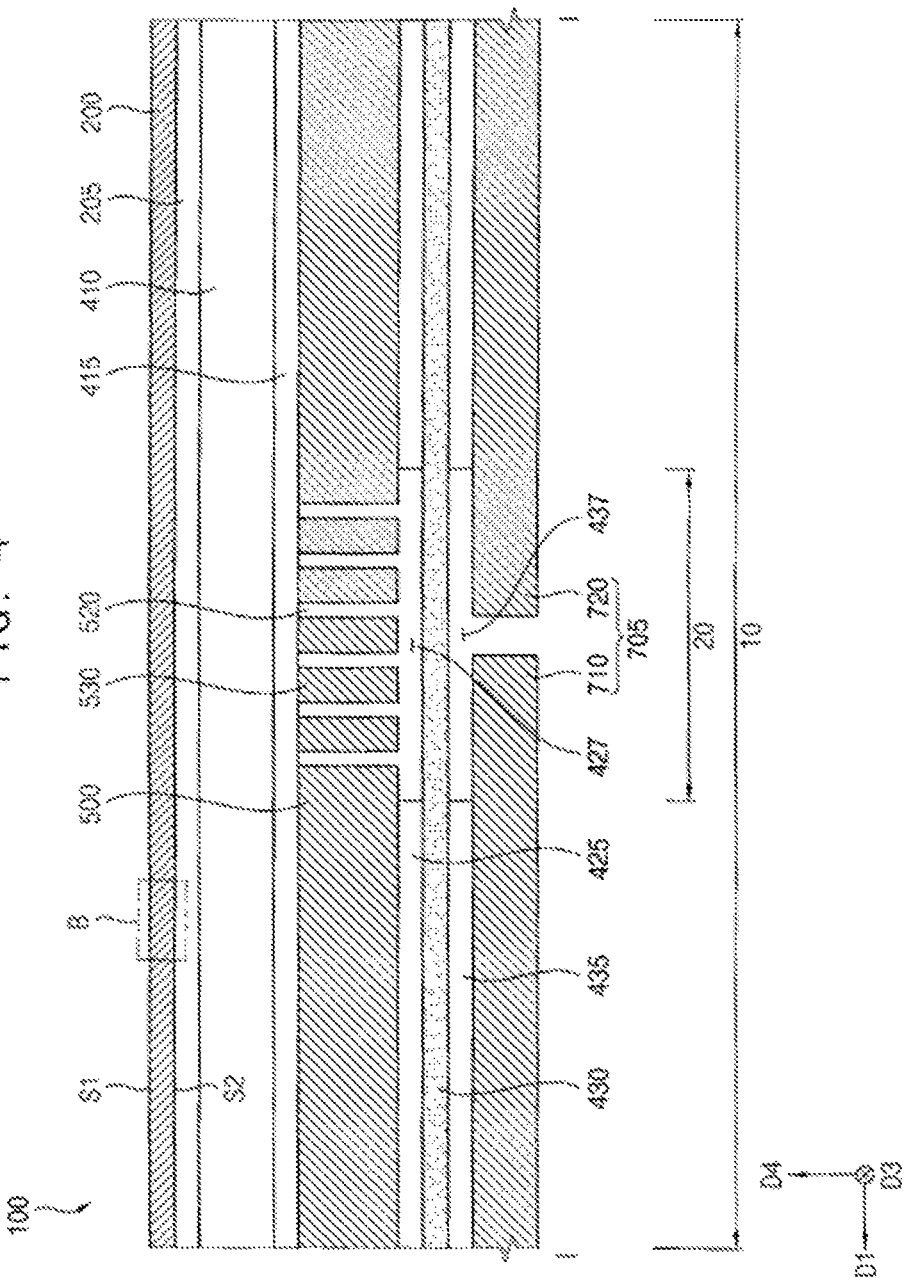
FIG. 4 is a cross-sectional view taken along line I-I' of the display device of FIG. 1.
Figure 5:
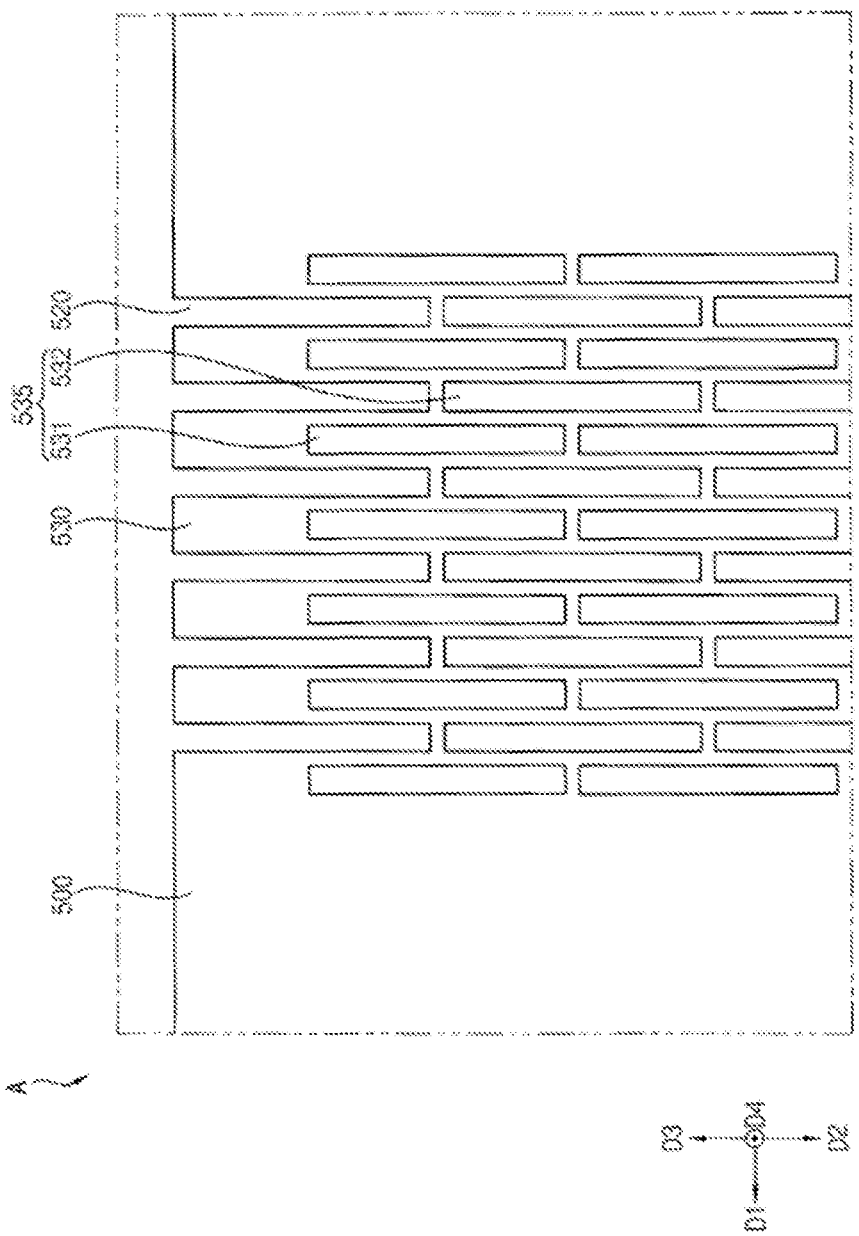
FIG. 5 is an enlarged planar view showing 'A' region of the display device of FIG. 1.

FIG. 1 is a plan view showing a display device according to an exemplary embodiment, FIG. 2 is a perspective view showing a folded shape of a display panel included in the display device of FIG. 1, FIG. 3 is a block diagram showing an external device electrically connected to the display device of FIG. 1 according to an exemplary embodiment, FIG. 4 is a cross-sectional view taken along line I-I' of the display device of FIG. 1, and FIG. 5 is an enlarged planar view showing 'A' region of the display device of FIG. 1. For example, FIGS. 1 and 4 show a state in which the display device is unfolded, and FIG. 1 shows a state in which a bending area of the display panel is bent.

Referring to FIGS. 1, 2, 4, and 5, a display device 100 may include a display panel 200, a shock absorbing member 410, a support member 500, an elastic member 430, and a first adhesive member 425, a second adhesive member 435, a third adhesive member 415, a fourth adhesive member 205, a metal member 705, and the like.

The display panel 200 may include a display area 10, a folding area 20, a pad area 30, and a bending area 50. A plurality of pixels may be disposed in the display area 10, and an image may be displayed in the display area 10 through the pixels. For example, the display panel 200 may have a first surface S1, on which an image is displayed, and a second surface S2 opposing the first surface S1. In addition, the display panel 200 may have a first side surface SS1 and a second side surface SS2 opposing the first side surface SS1. The folding area 20 may be an area in which the display panel 200 is folded or unfolded. A portion of the display area 10 may be defined as the folding area 20.

When the display panel 200 located in the folding area 20 is folded, the first side surface SS1 and the second side surface SS2 may be placed adjacent to each other. In addition, the display panel 200 located in the folding area 20 may form a curved shape when the display panel 200 is folded. In this case, the first surface S1 may be located on an inner side, and the second surface S2 may be located on an outer side, as shown in FIG. 2. Alternatively, the display panel 200 may be folded such that the first surface S1 is located on the outer side and the second surface S2 is located on the inner side.

In an exemplary embodiment, as shown in FIGS. 1 and 2, a portion of a side surface of the display panel 200 may be recessed inward. In particular, a groove may be formed in the portion of the side surface disposed between the first side surface SS1 and the second side surface SS2 of the display panel 200. For example, a functional module may be disposed at the portion where the groove is formed. The functional module may include a camera module, a face recognition sensor module, a pupil recognition sensor module, an acceleration sensor module, a proximity sensor module, an infrared sensor module, an illuminance sensor module, and the like.

Pad electrodes electrically connected to an external device 101 (see FIG. 3) may be disposed in the pad area 30, and connection electrodes electrically connecting the pad electrodes to the pixels may be disposed in the bending area 50. A portion of the pad area 30 may be defined as the bending area 50. When the bending area 50 is bent, the pad area 30 may be located on a bottom surface of the display panel 200, and a portion of the display area 10 and a portion of the pad area 30 may overlap each other. In an exemplary embodiment, a width of the pad area 30 may be smaller than a width of the display area 10, which is adjacent to the pad area 30. In particular, the pad area 30 may protrude from one side of the display area 10.

Although the display panel 200 has been described as having a polygonal shape when viewed in a plan view, the shape of the display panel 200 is not limited thereto. For example, in some exemplary embodiments, the display panel 200 may have a triangular shape, a rhombic shape, a rectangular shape, a circular shape, a track shape, or an elliptical shape, when viewed in a plan view.

In addition, as shown in FIG. 4, the metal member 705 may include a first metal member 710 and a second metal member 720. Furthermore, as shown in FIG. 5, a plurality of openings 535, a plurality of protrusions 530, and a plurality of trenches 520 may be formed in the support member 500.

Referring back to FIGS. 1, 2, 4, and 5, the display panel 200 may be provided. As the folding area 20 of the display panel 200 is folded or unfolded, the display device 100 may be folded or unfolded in the folding area 20.

The shock absorbing member 410 may be disposed on the second surface S2 of the display panel 200. In particular, the shock absorbing member 410 may be disposed between the support member 500 and the display panel 200. The shock absorbing member 410 may protect the display panel 200 from an external impact. In addition, the shock absorbing member 410 may include a flexible material so that the display panel 200 may be easily folded. For example, the shock absorbing member 410 may include a material having the form of a foam, such as a polyurethane foam, a polystyrene foam, or the like.

The support member 500 may be disposed on a bottom surface of the shock absorbing member 410. In particular, the support member 500 may be disposed on the second surface S2 of the display panel 200, and may include a plurality of openings 535 formed in the folding area 20. In an exemplary embodiment, the openings 535 may include openings 531 arranged in a first direction D1 parallel to a top surface of the display device 100, and openings 532 shifted in a second direction D2, which is perpendicular to the first direction D1, and arranged in the first direction D1. In addition, the support member 500 may further include a plurality of protrusions 530 protruding in a third direction D3 opposite to the second direction D2. Furthermore, a space between two adjacent protrusions among the protrusions 530 may be defined as a trench 520. In an exemplary embodiment, a width of the folding area 20, in which the openings 535 are formed in the first direction D1, may be approximately 7.95 millimeters, and a width of each of the openings 535 in the first direction D1 may be approximately 0.2 millimeters. In addition, an interval between two openings 535, which are adjacent to each other in the first direction D1 (e.g., a spaced distance between the two adjacent openings 535) among the openings 535, may be approximately 0.1 millimeter, and a pitch of the openings 535 in the first direction D1 may be approximately 0.3 millimeters. Furthermore, a length of each of the openings 535 in the second direction D2 (or the third direction D3) may be approximately 4 millimeters. When the openings 535 have the above dimensions, even when the display device 100 is repeatedly folded or unfolded, the folding area 20 of the display device 100 may not be damaged.

For example, the openings 535 may include first to $n^{th}$ openings (where n is an integer of 1 or more) arranged in the first direction D1, and a $k^{th}$ opening (where k is an even number between 1 and n) among the first to $n^{th}$ openings may be located at a position shifted in the second direction D2 perpendicular to the first direction D1. In addition, the support member 500 may further include protrusions located in the third direction D3 with respect to each of $(k-1)^{th}$ and $(k+1)^{th}$ openings among the first to $n^{th}$ openings, and the trench 520 may be defined by the protrusions.

The support member 500 may support the display panel 200, and may also assist the display panel 200 to be folded. For example, the support member 500 may be disposed over the second surface S2 of the display panel 200 to support the display panel 200, and the openings 535 formed in the folding area 20 may assist the display panel 200 to be folded. In addition, the openings 535 formed in the folding area 20 may prevent creases from being generated on the first surface S1 located in the folding area 20 of the display panel 200 from repeatedly folding and unfolding of the display panel 200.

In an exemplary embodiment, the openings 535 may be an empty space. In addition, when the display device 100 is folded and unfolded, a shape of each of the openings 535 may be deformed. For example, as each of the openings 535 has a geometric shape, the support member 500 located in the folding area 20 may be deformed in a longitudinal direction (e.g., the first direction D1) without being deformed in a depth direction (e.g., a direction from the support member 500 toward the display panel 200).

The support member 500 may include a metal or plastic having a relatively large elastic force or a relatively large restoring force. In an exemplary embodiment, the support member 500 may include steel use stainless (SUS). In some exemplary embodiments, the support member 500 may include alloys (e.g., super-elastic metals), such as nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium:iron (Co—Ni—Ga:Fe), silver-nickel (Ag—Ni), gold-cadmium (Au—Cd), iron-platinum (Fe—Pt), iron-nickel (Fe—Ni), and indium-cadmium (In—Cd).

Although each of the openings 535 has been described as having a rectangular shape when viewed in a plan view, the shape of each of the openings 535 is not limited thereto. For example, each of the openings 535 may have a triangular shape, a rhombic shape, a polygonal shape, a circular shape, a track shape, or an elliptical shape when viewed in a plan view.

The elastic member 430 may be disposed on a bottom surface of the support member 500. In particular, the elastic member 430 may overlap the openings 535 in the folding area 20 on the bottom surface of the support member 500. The elastic member 430 may prevent the openings 535 from being exposed in a fourth direction D4 perpendicular to the first to third directions D1, D2, and D3. In some exemplary embodiments, the elastic member 430 may not be disposed inside each of the openings 535 so that the openings 535 may be configured as empty spaces. While the display device 100 is repeatedly folded and unfolded, the elastic member 430 may prevent foreign substances from penetrating into the openings 535 and the trench 520 in the fourth direction D4. In addition, while the display device 100 is repeatedly folded and unfolded, the elastic member 430 may be extended and contracted to prevent the openings 535 from being exposed. The elastic member 430 may include an elastomer having a relatively large elastic force or a relatively large restoring force. For example, the elastic member 430 may include an elastic material, such as silicone, urethane, thermoplastic polyurethane (TPU), or nylon.

When a conventional display device is repeatedly folded and unfolded, foreign substances may penetrate into the openings 535 and the trench 520 in the fourth direction D4. The penetrated foreign substances may not escape out of the openings 535 and the trench 520. In this case, due to the foreign substances, the support member 500 located in the folding area 20 may be damaged, or the shapes of the openings 535 may be deformed, so that defects may be formed in the folding area 20 of the conventional display device.

According to an exemplary embodiment, the elastic member 430 is disposed on the openings 535 to prevent the openings 535 from being exposed in the fourth direction D4, so that the foreign substances may not penetrate into the openings 535 and the trench 520.

The first adhesive member 425 may be disposed between the support member 500 and the elastic member 430. A top surface of the first adhesive member 425 may make direct contact with the support member 500, and a bottom surface of the first adhesive member 425 may make direct contact with the elastic member 430. In an exemplary embodiment, the first adhesive member 425 may have a first opening 427, which overlaps the openings 535. In particular, the first opening 427 may overlap the folding area 20. That is, the first adhesive member 425 may adhere the elastic member 430 onto the bottom surface of the support member 500 except for the folding area 20. The first adhesive member 425 may not be disposed inside each of the openings 535 so that the openings 535 may be configured as empty spaces. In addition, when the display device 100 is folded and unfolded, the shape of each of the openings 535 may be deformed, and the shape of each of the openings 535 may be easily deformed because the first adhesive member 425 includes the first opening 427. Accordingly, the display device 100 may be easily folded and unfolded.

The first adhesive member 425 may include an optical clear adhesive (OCA), a pressure sensitive adhesive (PSA), a photocurable resin, a thermosetting resin, or the like. For example, the adhesive may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyether sulfone (PES), polyarylate (PAR), polycarbonate oxide (PCO), modified polyphenylene oxide (MPPO), and the like, and the resin may include an epoxy resin, an amino resin, a phenol resin, a urea resin, a melamine resin, an unsaturated polyester resin, a polyurethane resin, a polyimide resin, and the like.

The metal member 705 may be disposed on a bottom surface of the elastic member 430. For example, the first metal member 710 may be disposed at a first portion on the bottom surface of the elastic member 430, and the second metal member 720 may be disposed at a second portion of the bottom surface of the elastic member 430. In this case, each of the first and second portions of the elastic member 430 may partially overlap the folding area 20. In an exemplary embodiment, the first metal member 710 and the second metal member 720 may be spaced apart from each other in the first direction D1. The spaced distance may be determined according to a radius of curvature of the folding area 20. In addition, the metal member 705 may prevent the display panel 200 from sagging in the folding area 20, and may block static electricity, electromagnetic waves, electric fields, magnetic fields, and the like, which may be generated from an outside. The metal member 705 may include SUS. In some exemplary embodiments, the metal member 705 may include a metal, an alloy, metal nitride, conductive metal oxide, a transparent conductive material, etc. For example, the metal member 705 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other. In other exemplary embodiments, a step difference compensation member and an adhesive member may be additionally disposed on a bottom surface of the metal member 705. The adhesive member may make contact with a set member surrounding the display device 100, and the step difference compensation member may prevent the display panel 200 from sagging in the folding area 20 together with the metal member 705.

The second adhesive member 435 may be disposed between the elastic member 430 and the metal member 705. A top surface of the second adhesive member 435 may make direct contact with the elastic member 430, and a bottom surface of the second adhesive member 435 may make direct contact with the metal member 705. In an exemplary embodiment, the second adhesive member 435 may have a second opening 437, which overlaps the openings 535 and the first opening 427. In particular, the second opening 437 may overlap the folding area 20. As such, the second adhesive member 435 may adhere the metal member 705 onto the bottom surface of the elastic member 430 except for the folding area 20. In addition, when the display device 100 is folded and unfolded, the elastic member 430 located in the folding area 20 may be extended and contracted, and the elastic member 430 may be easily extended and contracted in the folding area 20 because the second adhesive member 435 includes the second opening 437. Accordingly, the display device 100 may be easily folded and unfolded. The second adhesive member 435 may include an OCA, a PSA, a photocurable resin, a thermosetting resin, or the like.

The third adhesive member 415 may be disposed between the shock absorbing member 410 and the support member 500. A top surface of the third adhesive member 415 may make direct contact with the shock absorbing member 410, and a bottom surface of the third adhesive member 415 may make direct contact with the support member 500. In addition, the third adhesive member 415 may cover the openings 535. The third adhesive member 415 may adhere the shock absorbing member 410 onto a top surface of the support member 500. In an exemplary embodiment, the third adhesive member 415 may not be disposed inside each of the openings 535, so that the openings 535 may be configured as empty spaces. The third adhesive member 415 may include an OCA, a PSA, a photocurable resin, a thermosetting resin, or the like.

The fourth adhesive member 205 may be disposed between the display panel 200 and the shock absorbing member 410. A top surface of the fourth adhesive member 205 may make direct contact with the display panel 200, and a bottom surface of the fourth adhesive member 205 may make direct contact with the shock absorbing member 410. In addition, the fourth adhesive member 205 may adhere the display panel 200 to the shock absorbing member 410. The fourth adhesive member 205 may include an OCA, a PSA, a photocurable resin, a thermosetting resin, or the like.

The display device 100 according to the illustrated exemplary embodiment includes the elastic member 430, which overlaps the openings 535, to prevent the openings 535 from being exposed in the fourth direction D4, so that the foreign substances may not penetrate into the openings 535 and the trench 520. Accordingly, defects may not occur in the folding area 20 of the display device 100.

In addition, the first adhesive member 425 includes the first opening 427, so that the shape of each of the openings 535 may be easily deformed. The second adhesive member 435 includes the second opening 437, so that the elastic member 430 may be easily extended and contracted in the folding area 20. Accordingly, the display device 100 may be easily folded and unfolded.

Figure 6:
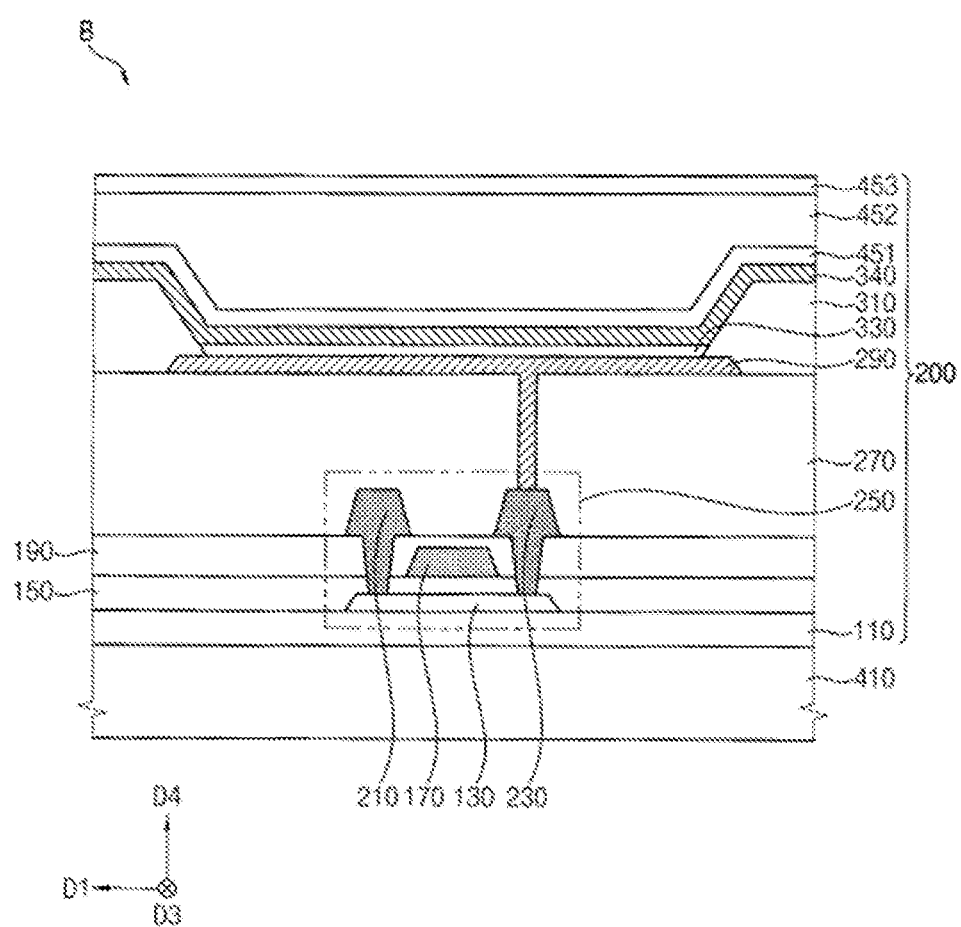
FIG. 6 is an enlarged cross-sectional view showing 'B' region of the display device of FIG. 4.

FIG. 6 is an enlarged cross-sectional view showing 'B' region of the display device of FIG. 4.

Referring to FIG. 6, the display panel 200 may include a substrate 110, a semiconductor element 250, a planarization layer 270, a lower electrode 290, a pixel defining layer 310, a light emitting layer 330, an upper electrode 340, a first thin film encapsulation layer 451, a second thin film encapsulation layer 452, a third thin film encapsulation layer 453, and the like. The semiconductor element 250 may include an active layer 130, a gate insulating layer 150, a gate electrode 170, an insulating interlayer 190, a source electrode 210, and a drain electrode 230.

The substrate 110 may include a transparent or opaque material. In an exemplary embodiment, the display panel 200 has a polygonal shape when viewed in a plan view, and thus, the substrate 110 may also have a polygonal shape when viewed in a plan view.

The substrate 110 may be disposed on the fourth adhesive member 205 (see FIG. 4), which is disposed on the shock absorbing member 410. The substrate 110 may be formed of a transparent resin substrate, such as a polyimide substrate. In this case, the polyimide substrate may include a first polyimide layer, a barrier film layer, a second polyimide layer, and the like. In other exemplary embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, etc.

A buffer layer may be disposed on the substrate 110. The buffer layer may prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer may serve to improve flatness of the surface of the substrate 110. Depending on a type of substrate 110, at least two buffer layers may be provided on the substrate 110, or the buffer layer may not be provided in some exemplary embodiments. The buffer layer may include an organic material or an inorganic material.

The active layer 130 may be disposed on the substrate 110. The active layer 130 may include a metal oxide semiconductor, an inorganic semiconductor (e.g., amorphous silicon or poly silicon semiconductor), an organic semiconductor, etc. The active layer 130 may have source and drain regions.

The gate insulating layer 150 may be disposed on the active layer 130. For example, the gate insulating layer 150 may sufficiently cover the active layer 130 on the substrate 110, and may have a substantially flat top surface without creating a step around the active layer 130. In some exemplary embodiments, the gate insulating layer 150 may be disposed along a profile of the active layer 130 with a uniform thickness to cover the active layer 130 on the substrate 110. The gate insulating layer 150 may include a silicon compound, metal oxide, etc. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In other exemplary embodiments, the gate insulating layer 150 may have a multilayer structure including a plurality of insulating layers. For example, the insulating layers may have mutually different thicknesses or may include mutually different materials.

The gate electrode 170 may be disposed on the gate insulating layer 150. The gate electrode 170 may be disposed at a portion of the gate insulating layer 150, under which the active layer 130 is located. The gate electrode 170 may include metal, an alloy, metal nitride, conductive metal oxide, a transparent conductive material, etc. For example, the gate electrode 170 may include Au, Ag, Al, W, Cu, Pt, Ni, Ti, Pd, Mg, Ca, Li, Cr, Ta, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other. In other exemplary embodiments, the gate electrode 170 may have a multilayer structure including a plurality of metal layers. For example, the metal layers may have mutually different thicknesses or may include mutually different materials.

The insulating interlayer 190 may be disposed on the gate electrode 170. The insulating interlayer 190 may sufficiently cover the gate electrode 170 on the gate insulating layer 150, and may have a substantially flat top surface without creating a step around the gate electrode 170. In some exemplary embodiments, the insulating interlayer 190 may be disposed along a profile of the gate electrode 170 with a uniform thickness to cover the gate electrode 170 on the gate insulating layer 150. The insulating interlayer 190 may include a silicon compound, metal oxide, etc. In some exemplary embodiments, the insulating interlayer 190 may have a multilayer structure including a plurality of insulating layers. For example, the insulating layers may have mutually different thicknesses or may include mutually different materials.

The source electrode 210 and the drain electrode 230 may be disposed on the insulating interlayer 190. The source electrode 210 may be connected to the source region of the active layer 130 through a contact hole formed by removing first parts of the gate insulating layer 150 and the insulating interlayer 190, and the drain electrode 230 may be connected to the drain region of the active layer 130 through a contact hole formed by removing second parts of the gate insulating layer 150 and the insulating interlayer 190. Each of the source electrode 210 and the drain electrode 230 may include metal, an alloy, metal nitride, conductive metal oxide, a transparent conductive material, etc. These may be used alone or in combination with each other. In other exemplary embodiments, each of the source electrode 210 and the drain electrode 230 may have a multilayer structure including a plurality of metal layers. For example, the metal layers may have mutually different thicknesses or may include mutually different materials.

Accordingly, the semiconductor element 250 including the active layer 130, the gate insulating layer 150, the gate electrode 170, the insulating interlayer 190, the source electrode 210, and the drain electrode 230 may be provided.

Although the semiconductor element 250 has been described as having a top gate structure, the inventive concepts are not limited thereto. For example, in some exemplary embodiments, the semiconductor element 250 may have a bottom gate structure, a double gate structure, etc.

In addition, although the display device 100 has been described as including one semiconductor element, the inventive concepts are not limited thereto. For example, the display device 100 may include at least one semiconductor element and at least one storage capacitor.

The planarization layer 270 may be disposed on the insulating interlayer 190, the source electrode 210, and the drain electrode 230. For example, the planarization layer 270 may have a relatively thick thickness. In this case, the planarization layer 270 may have a substantially flat top surface. In order to implement such a flat top surface of the planarization layer 270, a planarization process may be additionally performed on the planarization layer 270. In some exemplary embodiments, the planarization layer 270 may be disposed along a profile of the source electrode 210 and the drain electrode 230 with a uniform thickness on the insulating interlayer 190. The planarization layer 270 may be formed of an organic material or an inorganic material. In the illustrated exemplary embodiment, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, etc.

The lower electrode 290 may be disposed on the planarization layer 270. The lower electrode 290 may be connected to the drain electrode 230 through a contact hole formed by removing a portion of the planarization layer 270, and the lower electrode 290 may be electrically connected to the semiconductor element 250. The lower electrode 290 may include metal, an alloy, metal nitride, conductive metal oxide, a transparent conductive material, etc. These may be used alone or in combination with each other. In other exemplary embodiments, the lower electrode 290 may have a multilayer structure including a plurality of metal layers. For example, the metal layers may have mutually different thicknesses or may include mutually different materials.

The pixel defining layer 310 may be disposed on the planarization layer 270. For example, the pixel defining layer 310 may expose a portion of a top surface of the lower electrode 290 while covering both sides of the lower electrode 290. The pixel defining layer 310 may be formed of an organic material or an inorganic material. In the illustrated exemplary embodiment, the pixel defining layer 310 may include an organic material.

The light emitting layer 330 may be disposed on the pixel defining layer 310 and the lower electrode 290. The light emitting layer 330 may be formed by using at least one of light emitting materials for emitting different color lights (e.g., red light, green light, blue light, etc.) according to sub-pixels. Alternatively, the light emitting layer 330 may be formed by laminating a plurality of light emitting materials for emitting different color lights, such as red light, green light, and blue light to emit white light as a whole. In this case, a color filter may be disposed on the light emitting layer 330, which is disposed on the lower electrode 290. The color filter may include at least one of a red color filter, a green color filter, and a blue color filter. In some exemplary embodiments, the color filter may include a yellow color filter, a cyan color filter, and a magenta color filter. The color filter may include a photosensitive resin or a color photoresist.

The upper electrode 340 may be disposed on the light emitting layer 330 and the pixel defining layer 310. The upper electrode 340 may include metal, an alloy, metal nitride, conductive metal oxide, a transparent conductive material, etc. These may be used alone or in combination with each other. In other exemplary embodiments, the upper electrode 340 may have a multilayer structure including a plurality of metal layers. For example, the metal layers may have mutually different thicknesses or may include mutually different materials.

The first thin film encapsulation layer 451 may be disposed on the upper electrode 340. The first thin film encapsulation layer 451 may be disposed along a profile of the upper electrode 340 with a uniform thickness to cover the upper electrode 340. The first thin film encapsulation layer 451 may prevent the light emitting layer 330 from being deteriorated due to penetration of moisture, oxygen, or the like. In addition, the first thin film encapsulation layer 451 may protect the display panel 200 from an external impact. The first thin film encapsulation layer 451 may include inorganic materials having flexibility.

The second thin film encapsulation layer 452 may be disposed on the first thin film encapsulation layer 451. The second thin film encapsulation layer 452 may improve flatness of the display panel 200 and protect the display panel 200. The second thin film encapsulation layer 452 may include organic materials having flexibility.

The third thin film encapsulation layer 453 may be disposed on the second thin film encapsulation layer 452. The third thin film encapsulation layer 453 may be disposed along a profile of the second thin film encapsulation layer 452 with a uniform thickness to cover the second thin film encapsulation layer 452. The third thin film encapsulation layer 453 may prevent the light emitting layer 330 from being deteriorated due to the penetration of moisture, oxygen, or the like together with the first thin film encapsulation layer 451. In addition, the third thin film encapsulation layer 453 may protect the display panel 200 from an external impact together with the first thin film encapsulation layer 451 and the second thin film encapsulation layer 452. The third thin film encapsulation layer 453 may include inorganic materials having flexibility.

Accordingly, the display panel 200 including the substrate 110, the semiconductor element 250, the planarization layer 270, the lower electrode 290, the pixel defining layer 310, the light emitting layer 330, the upper electrode 340, the first thin film encapsulation layer 451, the second thin film encapsulation layer 452, and the third thin film encapsulation layer 453 may be provided.

Although the display device 100 has been described as being an organic light emitting diode display device, the inventive concepts are not limited thereto. In other exemplary embodiments, the display device 100 may include a liquid crystal display device (LCD), a field emission display device (FED), a plasma display device (PDP), or an electrophoretic image display device (EPD).

Figure 7:
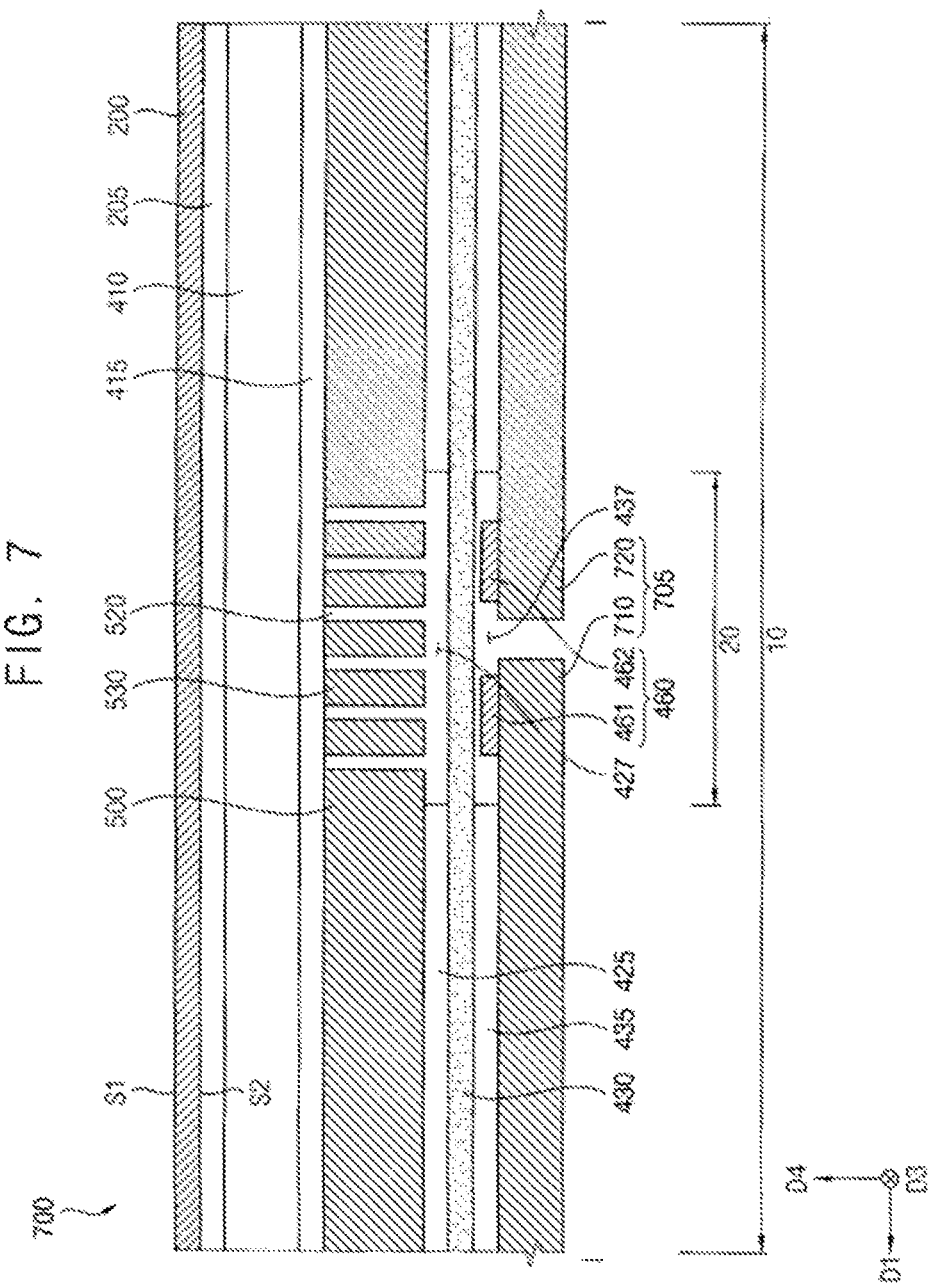
FIG. 7 is a cross-sectional view showing a display device according to another exemplary embodiment.

FIG. 7 is a cross-sectional view showing a display device according to another exemplary embodiment. A display device 700 illustrated in FIG. 7 may have a configuration substantially identical or similar to the configuration of the display device 100 described with reference to FIGS. 1 to 6, except for a step difference compensation member 460. As such, redundant descriptions of components substantially identical or similar to the components described with reference to FIGS. 1 to 6 will be omitted. FIG. 7 exemplarily shows a state when the display device 700 is unfolded.

Referring to FIG. 7, the display device 700 may include a display panel 200, a shock absorbing member 410, a support member 500, an elastic member 430, a first adhesive member 425, a second adhesive member 435, a third adhesive member 415, a fourth adhesive member 205, a metal member 705, a step difference compensation member 460, and the like. The display panel 200 may include a display area 10, a folding area 20, a pad area 30, and a bending area 50. The first adhesive member 425 may have a first opening 427, and the second adhesive member 435 may have a second opening 437. In addition, the metal member 705 may include a first metal member 710 and a second metal member 720, and the step difference compensation member 460 may include a first step difference compensation member 461 and a second step difference compensation member 462. Furthermore, a plurality of openings 535, a plurality of protrusions 530, and a plurality of trenches 520 may be formed in the support member 500, as shown in FIG. 5.

The first step difference compensation member 461 may be disposed on the first metal member 710 in the second opening 437. The second step difference compensation member 462 may be disposed on the second metal member 720 in the second opening 437. In the illustrated exemplary embodiment, a top surface of the step difference compensation member 460 may be spaced apart from the elastic member 430, so that the elastic member 430 may be easily extended and contracted in the folding area 20. The step difference compensation member 460 may prevent the display panel 200 from sagging in the folding area 20. For example, the step difference compensation member 460 may include metal, an alloy, metal nitride, conductive metal oxide, a transparent conductive material, etc. Alternatively, the step difference compensation member 460 may include PET, PEN, PP, PC, PS, PSul, PE, PPA, PES, PAR, PCO, MPPO, and the like.

For example, when the display device 700 is repeatedly folded and unfolded, elastic forces of the shock absorbing member 410 and the elastic member 430 may be distorted (e.g., elastic hysteresis). In this case, a sagging phenomenon may occur even when the display device 700 is in an unfolded state. Accordingly, in order to prevent the sagging phenomenon from occurring by a predetermined level or more, the display device 700 may include the step difference compensation member 460. In some exemplary embodiments, in order to further prevent the sagging phenomenon from occurring, an additional step difference compensation member 460 may be disposed on the elastic member 430 in the first opening 427.

The display device 700 according to the illustrated exemplary embodiment includes the step difference compensation member 460, so that in the display device 700, the sagging phenomenon of the display panel 200 may be prevented from occurring by a predetermined level or more.

Figure 8:
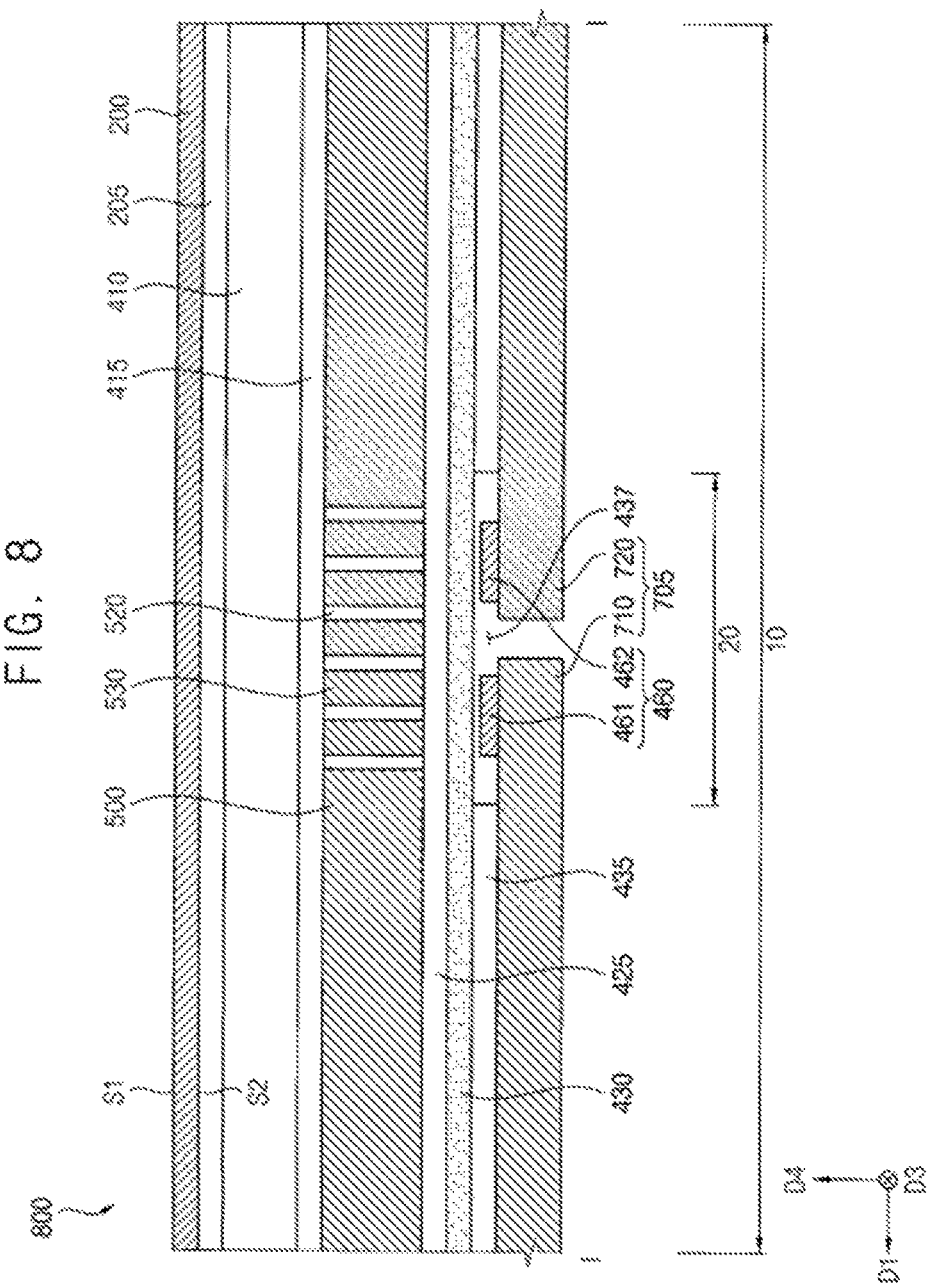
FIG. 8 is a cross-sectional view showing a display device according to another exemplary embodiment.

FIG. 8 is a cross-sectional view showing a display device according to another exemplary embodiment. A display device 800 illustrated in FIG. 8 may have a configuration substantially identical or similar to the configuration of the display device 700 described with reference to FIG. 7, except for a first adhesive member 425 that has no opening. As such, redundant descriptions of components substantially identical or similar to the components described with reference to FIG. 7 will be omitted. FIG. 8 exemplarily shows a state when the display device 800 is unfolded.

Referring to FIG. 8, the display device 800 may include a display panel 200, a shock absorbing member 410, a support member 500, an elastic member 430, a first adhesive member 425, a second adhesive member 435, a third adhesive member 415, a fourth adhesive member 205, a metal member 705, a step difference compensation member 460, and the like. The display panel 200 may include a display area 10, a folding area 20, a pad area 30, and a bending area 50. The second adhesive member 435 may have a second opening 437. In addition, the metal member 705 may include a first metal member 710 and a second metal member 720, and the step difference compensation member 460 may include a first step difference compensation member 461 and a second step difference compensation member 462. Furthermore, a plurality of openings 535, a plurality of protrusions 530, and a plurality of trenches 520 may be formed in the support member 500, as shown in FIG. 5.

The first adhesive member 425 may be disposed between the support member 500 and the elastic member 430. A top surface of the first adhesive member 425 may make direct contact with the support member 500, and a bottom surface of the first adhesive member 425 may make direct contact with the elastic member 430. In the illustrated exemplary embodiment, the first adhesive member 425 may cover the openings 535. The first adhesive member 425 may adhere the elastic member 430 onto the bottom surface of the support member 500. The first adhesive member 425 may not be disposed inside each of the openings 535, so that the openings 535 may be configured as empty spaces. In this manner, while the display device 800 is repeatedly folded and unfolded, the first adhesive member 425 may prevent foreign substances from penetrating into the openings 535 and the trench 520 in the fourth direction D4 together with the elastic member 430. In addition, while the display device 800 is repeatedly folded and unfolded, the first adhesive member 425 may be extended and contracted to prevent the openings 535 from being exposed. The first adhesive member 425 may include an OCA, a PSA, a photocurable resin, or a thermosetting resin, or the like.

The display device 800 according to the illustrated exemplary embodiments include the first adhesive member 425, which covers the openings 535, so that the foreign substances may be further prevented from penetrating into the openings 535 and the trench 520 in the fourth direction D4.

Figure 9:
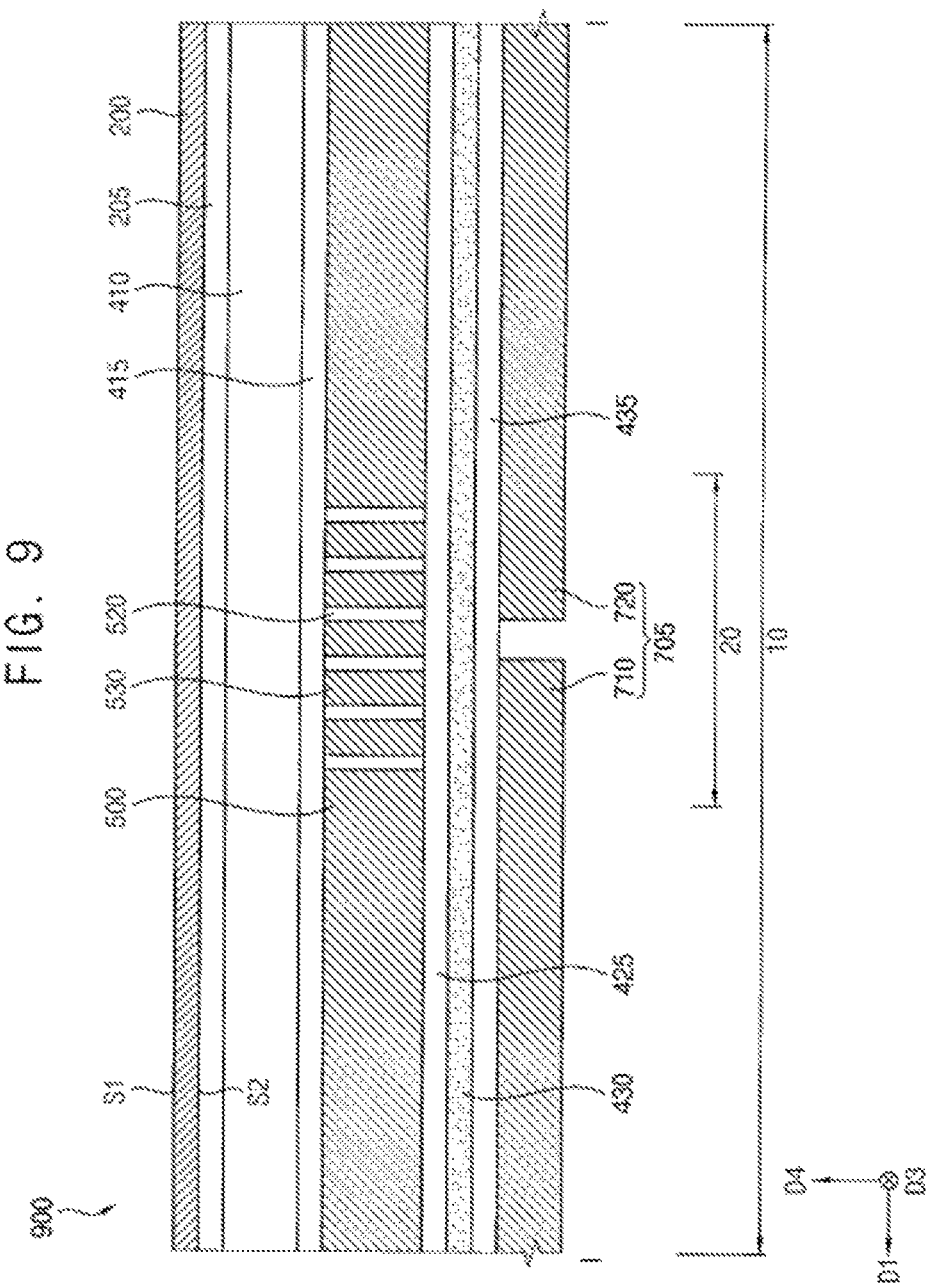
FIG. 9 is a cross-sectional view showing a display device according to another exemplary embodiment.

FIG. 9 is a cross-sectional view showing a display device according to another exemplary embodiment. A display device 900 illustrated in FIG. 9 may have a configuration substantially identical or similar to the configuration of the display device 100 described with reference to FIGS. 1 to 6, except for a first adhesive member 425 having no opening and a second adhesive member 435 having no opening. As such, redundant descriptions of components substantially identical or similar to the components described with reference to FIGS. 1 to 6 will be omitted. FIG. 9 exemplarily shows a state when the display device 900 is unfolded.

Referring to FIG. 9, the display device 900 may include a display panel 200, a shock absorbing member 410, a support member 500, an elastic member 430, a first adhesive member 425, a second adhesive member 435, a third adhesive member 415, a fourth adhesive member 205, a metal member 705, and the like. The display panel 200 may include a display area 10, a folding area 20, a pad area 30, and a bending area 50. In addition, the metal member 705 may include a first metal member 710 and a second metal member 720. Furthermore, a plurality of openings 535, a plurality of protrusions 530, and a plurality of trenches 520 may be formed in the support member 500, as shown in FIG. 5.

The first adhesive member 425 may be disposed between the support member 500 and the elastic member 430. A top surface of the first adhesive member 425 may make direct contact with the support member 500, and a bottom surface of the first adhesive member 425 may make direct contact with the elastic member 430. In the illustrated exemplary embodiment, the first adhesive member 425 may cover the openings 535. The first adhesive member 425 may adhere the elastic member 430 onto the bottom surface of the support member 500. The first adhesive member 425 may not be disposed inside each of the openings 535, so that the openings 535 may be configured as empty spaces. While the display device 900 is repeatedly folded and unfolded, the first adhesive member 425 may prevent foreign substances from penetrating into the openings 535 and the trench 520 in the fourth direction D4 together with the elastic member 430. In addition, while the display device 900 is repeatedly folded and unfolded, the first adhesive member 425 may be extended and contracted to prevent the openings 535 from being exposed. The first adhesive member 425 may include an OCA, a PSA, a photocurable resin, a thermosetting resin, or the like.

The second adhesive member 435 may be disposed between the elastic member 430 and the metal member 705. In particular, the second adhesive member 435 may also be disposed in the folding area 20. A top surface of the second adhesive member 435 may make direct contact with the elastic member 430, and a bottom surface of the second adhesive member 435 may make direct contact with the metal member 705. The second adhesive member 435 may adhere the metal member 705 onto the bottom surface of the elastic member 430. When the display device 900 is folded and unfolded, as the elastic member 430 located in the folding area 20 is extended and contracted, the second adhesive member 435 may also be extended and contracted. The second adhesive member 435 may include an OCA, a PSA, a photocurable resin, a thermosetting resin, or the like.

The display device 900 according to the illustrated exemplary embodiment includes the first adhesive member 425, which covers the openings 535, so that the foreign substances may be further prevented from penetrating into the openings 535 and the trench 520 in the fourth direction D4. In addition, the display device 900 includes the second adhesive member 435 disposed in the folding area 20, so that a sagging phenomenon of the display panel 200 may be prevented from occurring by a predetermined level or more.

Figure 10:
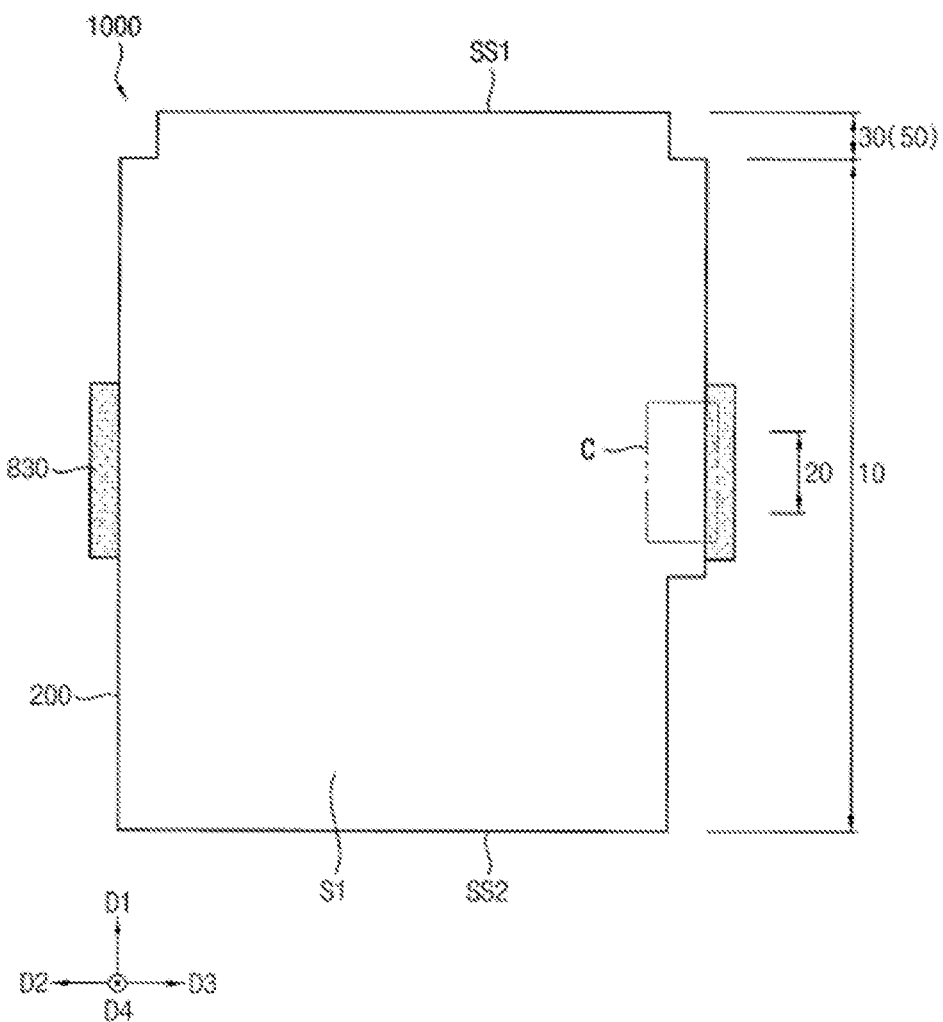
FIG. 10 is a plan view showing a display device according to an exemplary embodiment.
Figure 11:
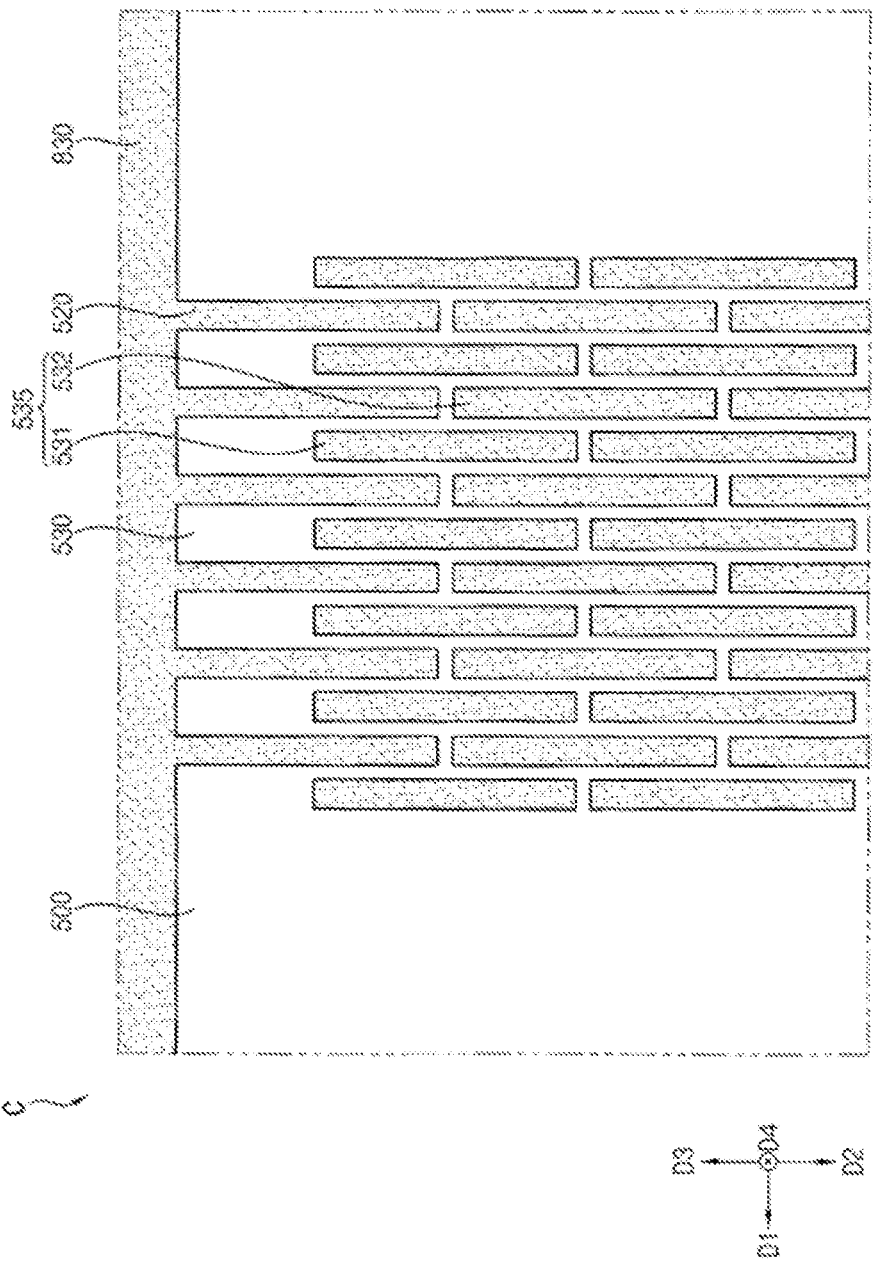
FIG. 11 is an enlarged planar view showing 'C' region of the display device of FIG. 10.
Figure 12:
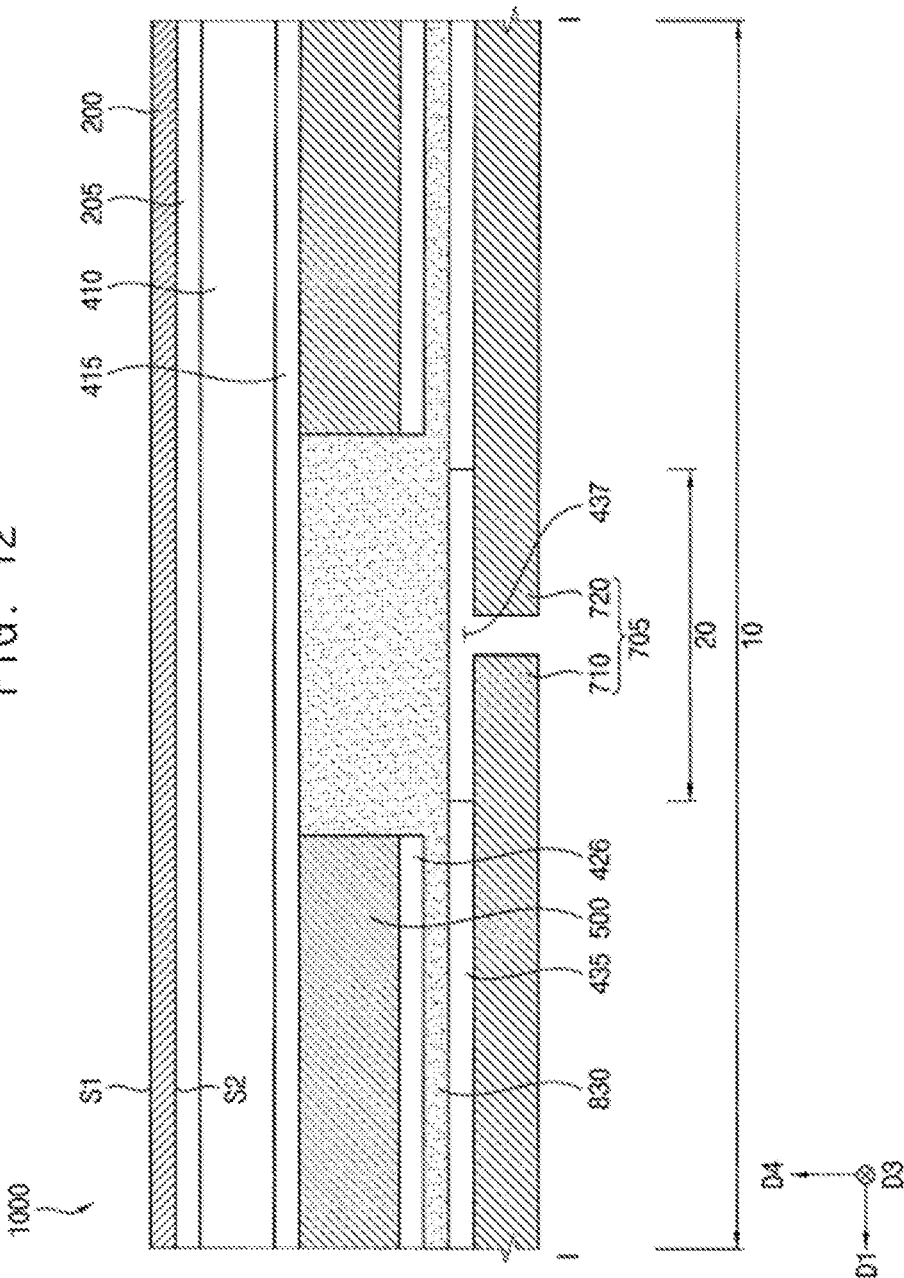
FIG. 12 is a side view showing a side surface of the display device of FIG. 10.

FIG. 10 is a plan view of a display device according to another exemplary embodiment, FIG. 11 is an enlarged planar view showing 'C' region of the display device of FIG. 10, and FIG. 12 is a side view showing a side surface of the display device of FIG. 10. A display device 1000 illustrated in FIGS. 10, 11, and 12 may have a configuration substantially identical or similar to the configuration of the display device 100 described with reference to FIGS. 1 to 6, except for an elastic member 830. As such, redundant descriptions of components substantially identical or similar to the components described with reference to FIGS. 1 to 6 will be omitted. FIGS. 10, 11, and 12 exemplarily show a state when the display device 1000 is unfolded.

Referring to FIGS. 10, 11, and 12, the display device 1000 may include a display panel 200, a shock absorbing member 410, a support member 500, an elastic member 830, a first adhesive member 425, a second adhesive member 435, a third adhesive member 415, a fourth adhesive member 205, a metal member 705, and the like. The display panel 200 may include a display area 10, a folding area 20, a pad area 30, and a bending area 50. The first adhesive member 425 may have a first opening 427, and the second adhesive member 435 may have a second opening 437. In addition, the metal member 705 may include a first metal member 710 and a second metal member 720. Furthermore, as shown in FIG. 11, a plurality of openings 535, a plurality of protrusions 530, and a plurality of trenches 520 may be formed in the support member 500. In FIG. 11, although the elastic member 830 disposed under the support member 500 is shown as being visible through the openings 535 and the trench 520, the elastic member 830 is not disposed in the openings 535 and the trench 520.

The elastic member 830 may be disposed on a portion of a bottom surface and a portion of a side surface of the support member 500. In particular, the elastic member 830 may overlap the openings 535 in the folding area 20 on the bottom surface of the support member 500 while extending to the side surface of the support member 500 to cover the trenches 520 in the folding area 20. In this manner, the elastic member 830 may prevent the openings 535 and the trenches 520 from being exposed. In the illustrated exemplary embodiment, the elastic member 830 may not be disposed inside each of the openings 535 and the trenches 520, so that the openings 535 and the trenches 520 may be configured as empty spaces. While the display device 1000 is repeatedly folded and unfolded, the elastic member 830 may prevent foreign substances from penetrating into the openings 535 and the trenches 520 in the second direction D2 and the fourth direction D4. In addition, while the display device 1000 is repeatedly folded and unfolded, the elastic member 830 may be extended and contracted to prevent the openings 535 and the trenches 520 from being exposed. The elastic member 830 may include an elastomer having a relatively large elastic force or a relatively large restoring force. For example, the elastic member 830 may include an elastic material, such as silicone, urethane, or TPU.

The display device 1000 according to the illustrated exemplary embodiment includes the elastic member 830, so that the openings 535 and the trenches 520 of the support member 500 may be completely covered, and the foreign substances may not be located in the openings 535 and the trench 520. Accordingly, defects in the display device 1000 may not occur due to penetration of the foreign substances.

Figure 13:
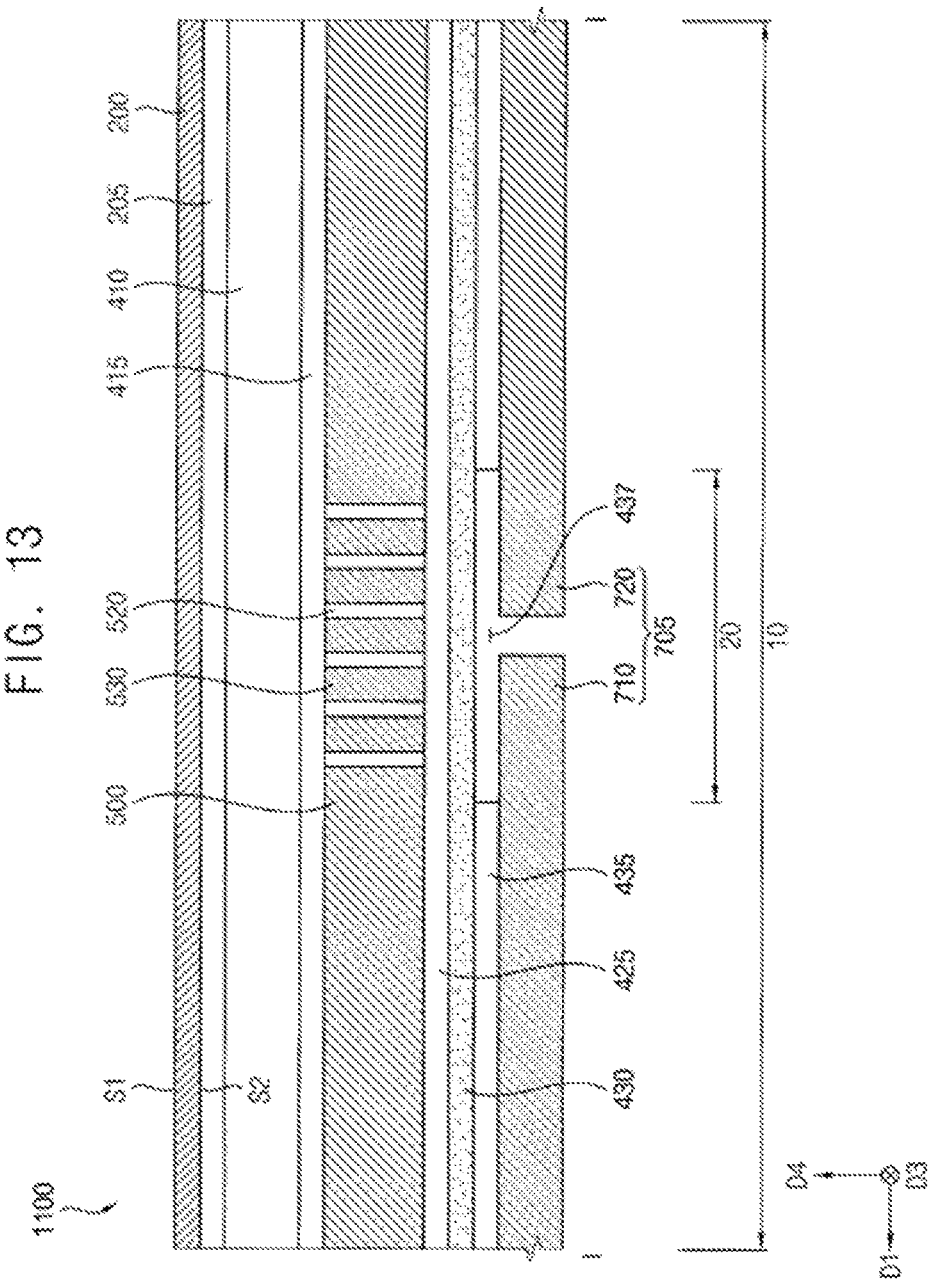
FIG. 13 is a cross-sectional view showing a display device according to another exemplary embodiment.

FIG. 13 is a cross-sectional view showing a display device according to another exemplary embodiment. A display device 1100 illustrated in FIG. 13 may have a configuration substantially identical or similar to the configuration of the display device 900 described with reference to FIG. 9, except for a first adhesive member 425 having no opening and a second adhesive member 435 having a second opening 437. As such, redundant descriptions of components substantially identical or similar to the components described with reference to FIG. 9 will be omitted. FIG. 13 exemplarily shows a state when the display device 1100 is unfolded.

Referring to FIG. 13, the display device 1100 may include a display panel 200, a shock absorbing member 410, a support member 500, an elastic member 430, a first adhesive member 425, a second adhesive member 435, a third adhesive member 415, a fourth adhesive member 205, a metal member 705, and the like. The display panel 200 may include a display area 10, a folding area 20, a pad area 30, and a bending area 50, and the second adhesive member 435 may have a second opening 437. In addition, the metal member 705 may include a first metal member 710 and a second metal member 720. Furthermore, a plurality of openings 535, a plurality of protrusions 530, and a plurality of trenches 520 may be formed in the support member 500, as shown in FIG. 5.

The exemplarily embodiments may be applied to various electronic devices including a display device. For example, the display device according to the exemplary embodiments may be applied to vehicle-display device, a ship-display device, an aircraft-display device, portable communication devices, display devices for display or for information transfer, a medical-display device, etc.

As the display device according to the exemplary embodiments includes the step difference compensation member, the sagging phenomenon of the display panel may be prevented from occurring by a predetermined level or more.

As the display device according to the exemplary embodiments includes the elastic member, the openings and the trenches of the support member may be completely covered, and the foreign substances may not be located in the openings and the trench. Accordingly, defects in the display device may not occur due to penetration of the foreign substances.

As the display device according to the exemplary embodiments includes the elastic member, which overlaps the openings to prevent the openings from being exposed in the fourth direction, the foreign substances may not penetrate into the openings and the trench. Accordingly, defects may not occur in the folding area of the display device due to the penetration of the foreign substances. In addition, the first adhesive member includes the first opening, so that the shape of each of the openings may be easily deformed. The second adhesive member includes the second opening, so that the elastic member may be easily extended and contracted in the folding area. Accordingly, the display device may be easily folded and unfolded.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel having a folding area and a bending area;
a support member disposed on a bottom surface of the display panel and including a plurality of openings formed in the folding area;
an elastic member disposed on a bottom surface of the support member and overlapping the openings in the folding area; and
a first adhesive member disposed between the support member and the elastic member.

2. The display device of claim 1, wherein:
the display panel further includes a display area;
a portion of the display area is defined as the folding area; and
a portion of a side surface of the display panel in the display area has a shape that is recessed inwardly.

3. The display device of claim 1, wherein:
the display panel further includes a pad area; and
a portion of the pad area is defined as the bending area.

4. The display device of claim 3, wherein:
the pad area overlaps a display area on the bottom surface of the display panel when the bending area is bent; and
a width of the pad area is less than a width of the display area.

5. The display device of claim 1, wherein the first adhesive member has a first opening which overlaps the folding area.

6. The display device of claim 5, wherein the first opening overlaps the openings of the support member.

7. The display device of claim 1, further comprising:
a first metal member disposed on a first portion of a bottom surface of the elastic member; and
a second metal member disposed on a second portion of the bottom surface of the elastic member while being spaced apart from the first metal member.

8. The display device of claim 7, wherein each of the first and second portions partially overlaps the folding area.

9. The display device of claim 7, further comprising a second adhesive member disposed between the first and second metal members and the elastic member.

10. The display device of claim 9, wherein the second adhesive member has a second opening which overlaps the folding area.

11. The display device of claim 10, wherein the second opening overlaps the openings of the support member.

12. The display device of claim 10, further comprising:
a first step difference compensation member disposed on the first metal member in the second opening; and
a second step difference compensation member disposed on the second metal member in the second opening.

13. The display device of claim 12, wherein a top surface of each of the first and second step difference compensation members is spaced apart from the elastic member.

14. The display device of claim 1, wherein:
the openings of the support member include first to $n^{th}$ openings arranged in a first direction parallel to a top surface of the display panel, n being an integer of 1 or more; and
a $k^{th}$ opening among the first to $n^{th}$ openings is located at a position shifted in a second direction perpendicular to the first direction, k being an even number between 1 and n.

15. The display device of claim 14, wherein the support member further includes protrusions located in a third direction opposite to the second direction with respect to each of $(k-1)^{th}$ and $(k+1)^{th}$ openings among the first to $n^{th}$ openings.

16. The display device of claim 15, further comprising a trench disposed in a space between two adjacent protrusions, wherein the elastic member extends to a side surface of the support member to cover the trench.

17. The display device of claim 1, further comprising a shock absorbing member disposed between the support member and the display panel.

18. The display device of claim 17, further comprising:
a third adhesive member disposed between the shock absorbing member and the support member; and
a fourth adhesive member disposed between the display panel and the shock absorbing member.

19. The display device of claim 18, wherein the third adhesive member covers the openings.

20. The display device of claim 1, wherein the opening is configured as an empty space.

* * * * *